(12) United States Patent
Pavisic et al.

(10) Patent No.: US 6,550,044 B1
(45) Date of Patent: Apr. 15, 2003

(54) METHOD IN INTEGRATING CLOCK TREE SYNTHESIS AND TIMING OPTIMIZATION FOR AN INTEGRATED CIRCUIT DESIGN

(75) Inventors: Ivan Pavisic, San Jose, CA (US); Aiguo Lu, Cupertino, CA (US); Andrej A. Zolotykh, Moskovskaya Oblast (RU); Elyar E. Gasanov, Moscow (RU)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/885,589

(22) Filed: Jun. 19, 2001

(51) Int. Cl.[7] .............................................. G06F 17/50
(52) U.S. Cl. ............................................. 716/6; 716/18
(58) Field of Search ........................... 716/2, 6, 18, 12, 716/4

(56) References Cited

U.S. PATENT DOCUMENTS 5,452,239 A * 9/1995 Dai et al. ...................... 703/19
6,378,123 B1 * 4/2002 Dupenloup .................. 716/18

OTHER PUBLICATIONS

Vittal, Ashok and Marek–Sadowska, Malgorzata; "Power Optimal Buffered Clock Tree Design", Dept. of Electrical and Computer Engineering, University of California, Santa Barbara, CA, 1995, pp.497–502.
Toyonaga, Masahiko, Kurokawa, Keiichi, Yasui, Takuya and Takahashi, Atsushi; "A Pratical Clock Tree Synthesis for Semi–Synchronous Circuits", Matsushita Electric Industrial Co., Ltd., Osaka, Japan, and Tokyo Institute of Technology, Tokyo, Japan, 2000, pp. 159–164

* cited by examiner

Primary Examiner—Don Wong
Assistant Examiner—Thuy Vinh Tran
(74) Attorney, Agent, or Firm—Fitch, Even, Tabin & Flannery

(57) ABSTRACT

A method of synthesizing a clock tree for an integrated circuit design is disclosed that includes the steps of constructing an initial balanced clock tree for an integrated circuit design; calculating a clock arrival time for each clock driven cell in the initial clock tree; performing a timing analysis from the clock arrival time calculated for each clock driven cell; and performing a skew optimization concurrently with the timing analysis to correct timing violations discovered by the timing analysis.

9 Claims, 3 Drawing Sheets

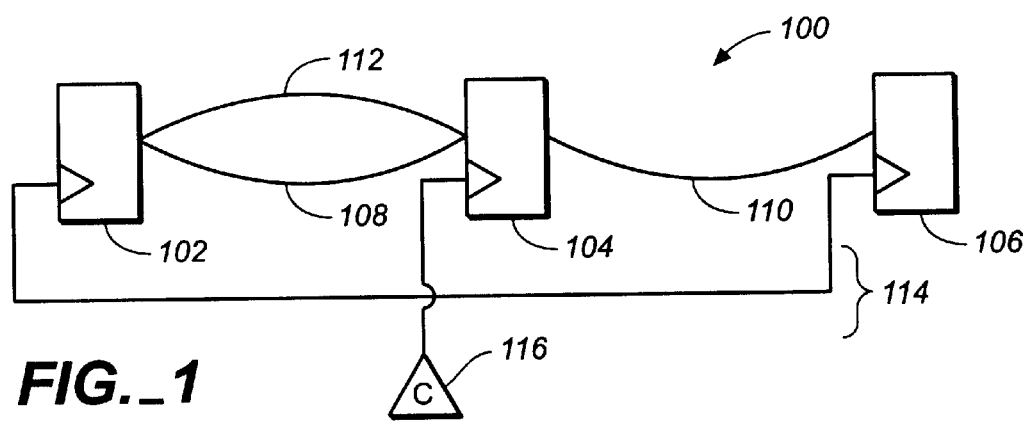
FIG._1
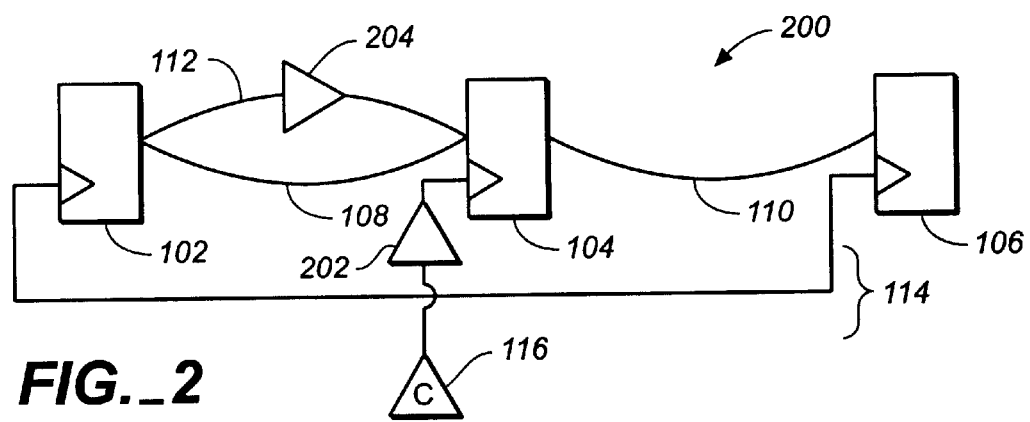
FIG._2
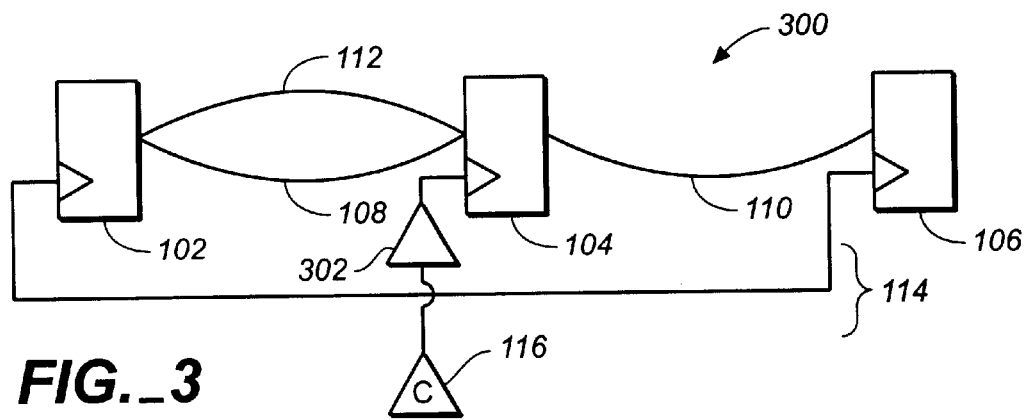
FIG._3

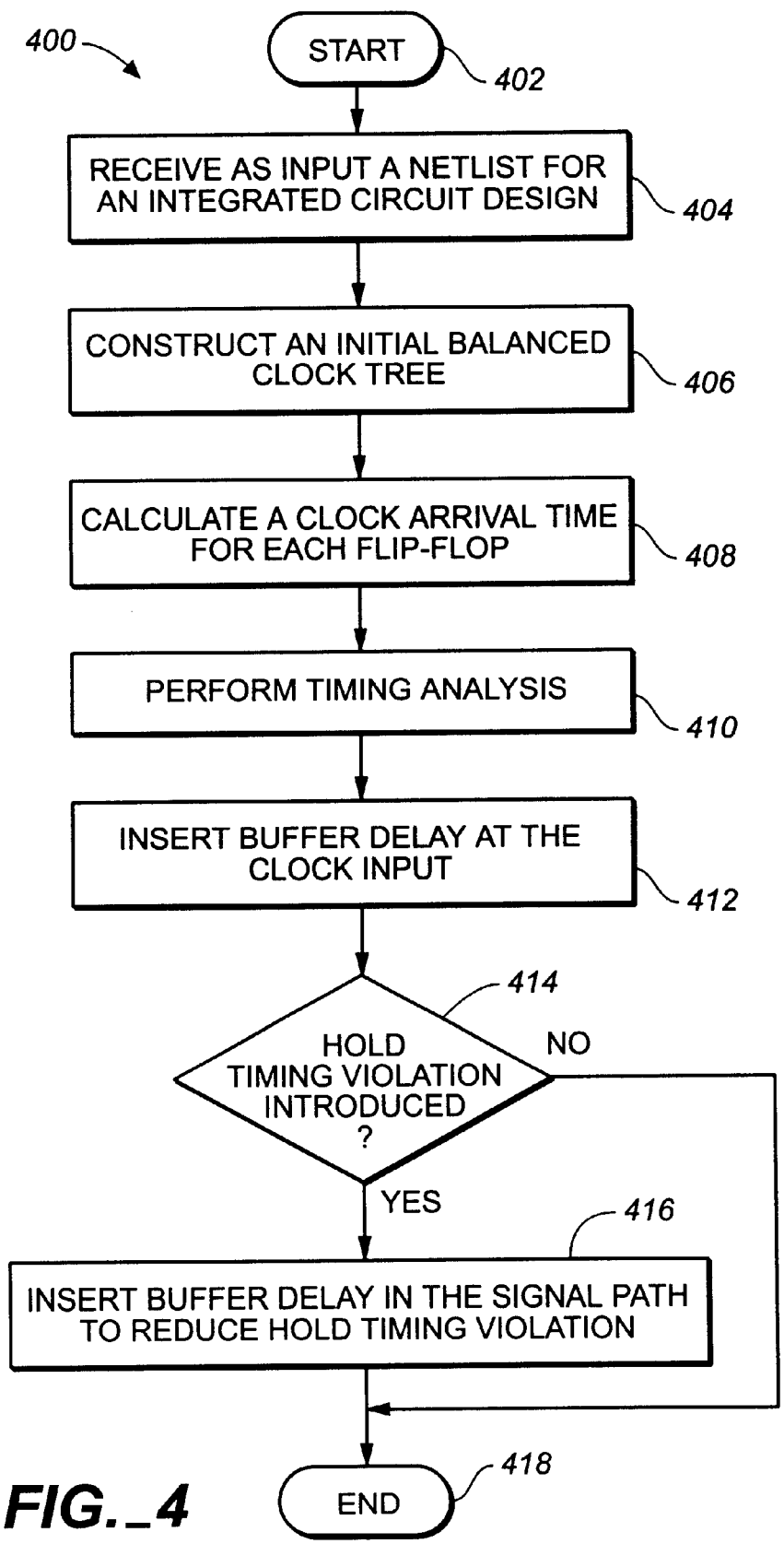
FIG._4

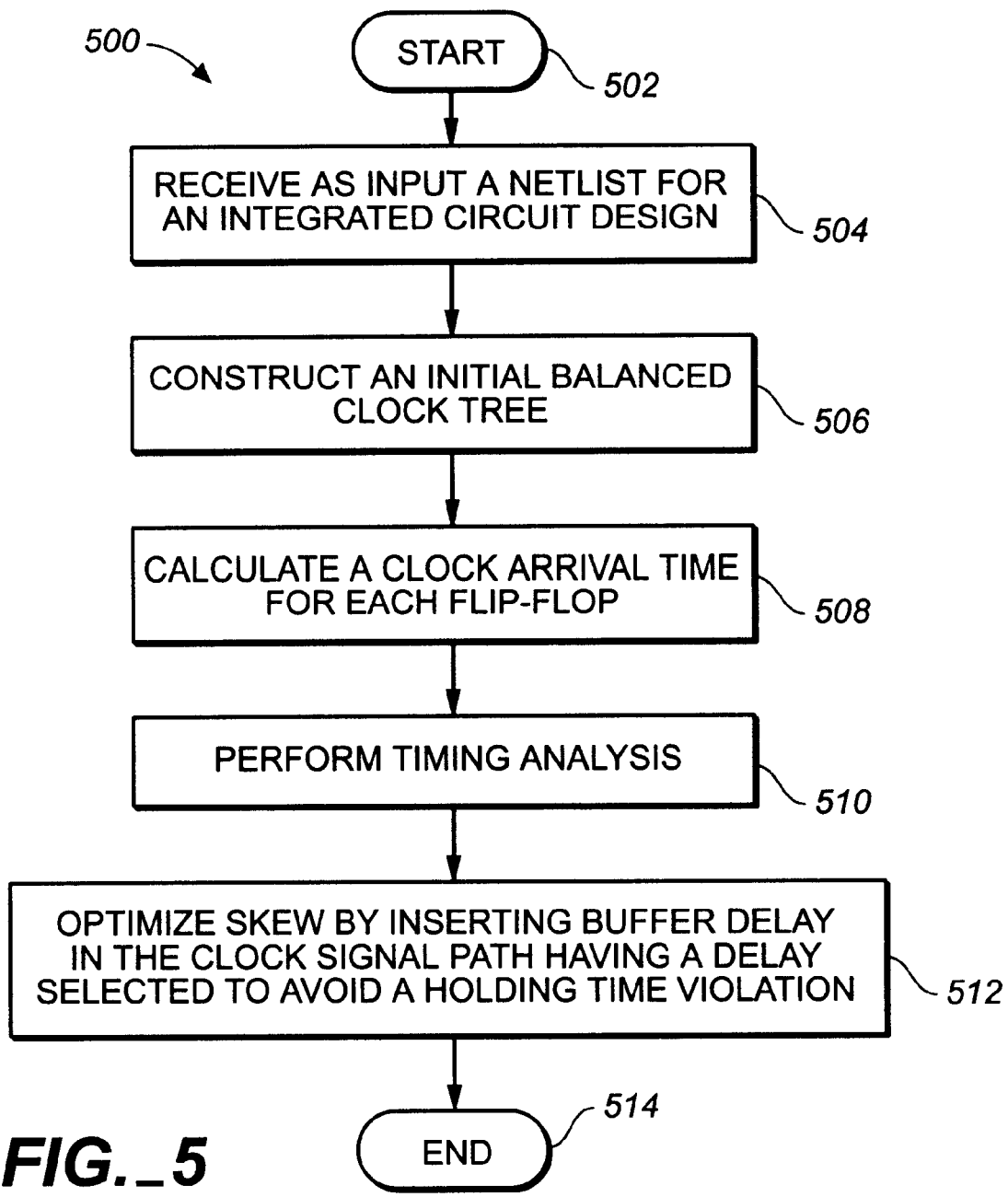
FIG._5

METHOD IN INTEGRATING CLOCK TREE SYNTHESIS AND TIMING OPTIMIZATION FOR AN INTEGRATED CIRCUIT DESIGN

BACKGROUND OF THE INVENTION

The present invention relates generally to electronic circuit design using computer simulation techniques. More specifically, but without limitation thereto, the present invention relates to synthesizing and optimizing a clock tree for an integrated circuit design.

Previous methods for achieving timing closure in deep sub-micron technology include two separate tasks. First, in-place timing optimization for a netlist is performed assuming an ideal clock, that is, a clock that arrives at each clock driven cell at the same time. Second, a zero balanced clock tree is synthesized to distribute the clock to each clock driven cell in the integrated circuit design. An example of such a method is described by Asok Vittal, et al., *Power Optimal Buffered Clock Tree Design*, Design Automation Conference 1995, pp. 497–502.

In a more advanced approach, the concept of "useful" clock skew is introduced. The main idea of this approach is to deliver the clock signal to certain flip-flops earlier or later than to other flip-flops to create extra timing margin for slower timing paths. The timing optimization is still performed as two separate tasks. First, desired (or virtual) clock skews are considered, and a "skew schedule" is created. Second, a clock tree synthesis is performed to synthesize the clock tree to meet the skew schedule. Clock synthesis tools can modify or even recreate a skew schedule, however these tools do not perform netlist timing optimization. An example of such a clock synthesis tool is described in Masahiko Totonaga, et al., *A Practical Clock Tree Synthesis for Semi-Synchronous Circuits*, ISPD 2000, pp. 159–164 International Symposium on Physical Design.

SUMMARY OF THE INVENTION

The present invention advantageously addresses the needs above as well as other needs by providing a method of synthesizing a clock tree and performing timing optimization concurrently.

In one embodiment, the invention may be characterized as a method of synthesizing a clock tree for an integrated circuit design that includes the steps of constructing an initial balanced clock tree for an integrated circuit design; calculating a clock arrival time for each clock driven cell in the initial clock tree; performing a timing analysis from the clock arrival time calculated for each clock driven cell; and performing a skew optimization concurrently with the timing analysis to correct timing violations discovered by the timing analysis.

In another embodiment, the invention may be characterized as a computer program product that includes a medium for embodying a computer program for input to a computer and a computer program embodied in the medium for causing the computer to perform the following functions: constructing an initial balanced clock tree for an integrated circuit design; calculating a clock arrival time for each clock driven cell in the initial clock tree; performing a timing analysis from the clock arrival time calculated for each clock driven cell; and performing a skew optimization concurrently with the timing analysis to correct timing violations discovered by the timing analysis.

The features and advantages summarized above in addition to other aspects of the present invention will become more apparent from the description, presented in conjunction with the following drawings.

BRIEF DESCRIPTION OF THE DRAWINGS

FIG. 1 is a diagram of an integrated circuit design with a balanced clock tree;

FIG. 2 is a diagram of the integrated circuit design of FIG. 1 optimized by inserting buffer delays at a clock input of a clock driven cell and in a signal path between two clock driven cells;

FIG. 3 is a diagram of the integrated circuit design of FIG. 1 optimized by inserting a buffer delay at a clock input of a clock driven cell wherein the buffer delay is selected to avoid creating a hold timing violation;

FIG. 4 is a flowchart of a method of integrating clock tree synthesis and timing optimization for an integrated circuit design as illustrated in FIG. 2; and FIG. 5 is a flowchart of a method of integrating clock tree synthesis and timing optimization for an integrated circuit design as illustrated in FIG. 3.

Corresponding reference characters indicate corresponding elements throughout the several views of the drawings.

DETAILED DESCRIPTION OF THE EMBODIMENTS

An important and novel feature of the method of the present invention is that the clock tree is synthesized and optimized concurrently with the netlist, preferably during the post-placement resynthesis phase. This approach provides several important advantages, such as a larger solution space for resolving timing violations in the design, dynamic optimization of the clock tree, and simplicity of implementation.

In the method of the present invention, an initial or seed placement is performed for a netlist assuming an ideal clock, that is, it is assumed that the clock signal arrives simultaneously at each clock driven cell, or flip-flop. After the initial placement, an in-place optimization process is performed and placement changes are made with the multiple objectives of timing optimization, area reduction, and correction of ramptime violations. The in-place optimization may be performed, for example, by well known techniques for buffer optimization, gate resizing, and logic restructuring. The quality of the in-place optimization is then estimated by performing a timing analysis with the assumption of an ideal clock dynamically, that is, comparing the result of each change made to the previous result to determine the effect of the change on the optimization.

After the initial placement and optimization, a balanced clock tree is constructed according to well known techniques. The actual clock arrival time at each flip-flop is then calculated, and a timing analysis is performed using the calculated clock arrival times. This approach creates the possibility for the novel optimization technique of performing buffer optimization on the clock tree concurrently with the timing analysis, that is, the effect of each change made to the clock tree or to the netlist is analyzed as the change is made, allowing the designer to explore solutions to timing problems during cell placement. The objective of buffer optimization on the clock tree, or skew optimization, is to change clock arrival time at certain flip-flops to fix timing violations on paths that begin or end with those flip-flops.

Skew optimization requires the capability to recognize and correct potential hold time violations, since changing the clock arrival time, or skew, at a flip-flop introduces potential hold time violations on the short paths. This problem may be solved, for example, by controlling the skew optimization so that it does not create new hold time violations. Alternatively, the skew may be optimized as much as needed for timing optimization, and the hold time violations introduced during this process may be corrected afterward. These techniques are illustrated in the examples given below.

FIG. 1 is a diagram 100 of an integrated circuit design with a balanced clock tree. Shown in FIG. 1 are flip-flops 102, 104, and 106, signal paths 108, 110, and 112, a balanced clock tree 114, and a clock buffer 116.

The clock buffer 116 buffers a clock signal to each of the flip-flops 102, 104, and 106 through the balanced clock tree 114 so that the clock signal arrives at each of the flip-flops 102, 104, and 106 at the same time. In a zero clock skew scheme, the delays of all paths must be smaller than the clock period for the circuit to operate properly. If a path is faster than the clock period, then the path has a margin, or positive slack, equal to the difference between the clock period and the path delay. If a path is slower than the clock period, then the path violates timing, or has a negative slack. If, for example, the clock signal has a period of 10 ns, and the signal paths 108, 110, and 112 have delays of 11 ns, 9 ns, and 10.5 ns respectively, then the signal path 108 has a timing violation of 1 ns, and the signal path 110 has a margin of 1 ns. The objective of skew optimization is to delay the arrival of the clock signal at the flip-flop 104 so that the total timing violation is reduced. By inserting a buffer delay of 1 ns to delay the arrival of the clock signal only at the flip-flop 104, then there is no timing violation for the signal paths 108 and 110, however, a hold time violation is introduced for the signal path 112. A hold time violation occurs if a path is too fast and the signal is captured at the receiving flip-flop in the same clock cycle. In the example of FIG. 1, a hold time violation exists for the path 112. The signal originating from the flip-flop 102 arrives at the flip-flop 104 after 10.5 ns, which is 0.5 ns before the clock (in the same cycle) arrives at the flip-flop 104. For the circuit to work properly, this signal must be captured at the next clock cycle. This problem may be solved by the arrangement shown in FIG. 2.

FIG. 2 is a diagram 200 of the integrated circuit design of FIG. 1 optimized by inserting buffer delays at a clock input of a clock driven cell and in a signal path between two clock driven cells. Shown in FIG. 2 are flip-flops 102, 104, and 106, signal paths 108, 110, and 112, a balanced clock tree 114, a clock buffer 116, and inserted buffer delays 202 and 204. In this example, the inserted buffer delay 202 has a selected delay of 1 ns, and the inserted buffer delay 204 has a selected delay of 0.5 ns. By inserting the buffer delays 202 and 204, the timing violations for the signal paths 202 and 204 are corrected while avoiding introducing a hold time violation for the signal path 112.

Alternatively, the insertion delay buffer 202 may have a delay selected to avoid introducing a hold time violation for the signal path 112 as shown in FIG. 3.

FIG. 3 is a diagram 300 of the integrated circuit design of FIG. 1 optimized by inserting a buffer delay at a clock input of a clock driven cell wherein the buffer delay is selected to avoid creating a hold timing violation. Shown in FIG. 3 are flip-flops 102, 104, and 106, signal paths 108, 110, and 112, a balanced clock tree 114, a clock buffer 116, and an inserted delay buffer 302.

In this example, if the insertion delay buffer 302 has a delay of 0.5 ns, then there will be no hold timing violation for the signal path 112. The timing violation on the signal path 108 is not eliminated, but it is reduced from 1 ns to 0.5 ns. The remaining timing violation may be reduced according to standard techniques well known in the art.

FIG. 4 is a flowchart 400 of a method of integrating clock tree synthesis and timing optimization for an integrated circuit design as illustrated in FIG. 2.

Step 402 is the entry point for the flowchart 400.

In step 404, a description of an integrated circuit design, such as a netlist, is received as input.

In step 406, an initial balanced clock tree is constructed for an integrated circuit design.

In step 408, a clock arrival time is calculated for each flip-flop in the initial clock tree.

In step 410, a timing analysis is performed from the clock arrival time calculated for each flip-flop. A skew optimization is then performed as described below to reduce timing violations discovered by the timing analysis.

In step 412, skew optimization is performed by inserting a buffer delay at the clock input of a flop-flop in the balanced clock tree.

In step 414, if a hold timing violation is introduced in step 412, then processing is continued at step 416. Otherwise, processing continues at step 418.

In step 416, a buffer delay is inserted in the signal path between two flip-flops to reduce the hold timing violation.

Step 418 is the exit point for the flowchart 400.

FIG. 5 is a flowchart 500 of a method of integrating clock tree synthesis and timing optimization for an integrated circuit design as illustrated in FIG. 3.

Step 502 is the entry point for the flowchart 400.

In step 504, a description of an integrated circuit design, such as a netlist, is received as input.

In step 506, an initial balanced clock tree is constructed for an integrated circuit design.

In step 508, a clock arrival time is calculated for each flip-flop in the initial clock tree.

In step 510, a timing analysis is performed from the clock arrival time calculated for each flip-flop. A skew optimization is then performed as described above to reduce timing violations discovered by the timing analysis.

In step 512, clock skew is optimized by inserting a buffer delay at a clock input of a flip-flop in the balanced clock tree having a delay selected to avoid introducing a hold timing violation.

Step 514 is the exit point for the flowchart 500.

Although the method illustrated in the flowcharts 400 and 500 have been described and shown with reference to specific steps performed in a specific order, these steps may be combined, sub-divided, or reordered without departing from the scope of the claims. Unless specifically indicated herein, the order and grouping of steps is not a limitation of the present invention.

The method illustrated in the flowcharts 400 and 500 may be embodied in a computer program product and implemented by a computer according to well known programming techniques to perform the following functions: constructing an initial balanced clock tree for an integrated circuit design; calculating a clock arrival time for each clock driven cell in the initial clock tree; performing a timing analysis from the clock arrival time calculated for each clock driven cell; and performing a skew optimization concurrently with the timing analysis to correct timing violations discovered by the timing analysis.

An advantage of performing the skew optimization concurrently with the timing analysis is that the clock tree or the netlist may be changed during the timing analysis to resolve timing violations that could not be solved in the current design. By maintaining an updated clock tree during the optimization process, actual clock skews and the positions of clock buffers are available for timing analysis, enabling dynamic optimization of the clock tree during cell placement.

Other modifications, variations, and arrangements of the present invention may be made in accordance with the above teachings other than as specifically described to practice the invention within the spirit and scope defined by the following claims.

What is claimed is:

1. A method of synthesizing a clock tree for an integrated circuit design comprising the steps of:
   (a) constructing an initial balanced clock tree for an integrated circuit design;
   (b) calculating a clock arrival time for each clock driven cell in the initial clock tree;
   (c) performing a timing analysis from the clock arrival time calculated for each corresponding clock driven cell;
   (d) if a signal path having a first hold time violation is detected by the timing analysis, then inserting a first buffer to delay the clock arrival time at the corresponding clock driven cell by a first selected delay time to correct the first hold time violation; and
   (e) if a second hold time violation is introduced in a second signal path by the insertion of the first buffer, then inserting a second buffer in the second signal path to delay a signal arrival time by a second selected delay time to correct the second hold time violation.

2. The method of claim 1 wherein step (d) comprises inserting the first buffer at a clock input of the corresponding clock driven cell in the balanced clock tree.

3. The method of claim 1 wherein the first buffer is selected so as not to create a hold timing violation in another signal path.

4. The method of claim 1 wherein step (e) comprises inserting the second buffer in a signal path between two clock driven cells.

5. The method of claim 1 further comprising updating the balanced clock tree when a buffer is inserted therein for concurrent analysis of timing problems during cell placement.

6. A computer program product comprising:
   a medium for embodying a computer program for input to a computer; and
   a computer program embodied in the medium for causing the computer to perform the following functions:
   (a) constructing an initial balanced clock tree for an integrated circuit design;
   (b) calculating a clock arrival time for each clock driven cell in the initial clock tree;
   (c) performing a timing analysis from the clock arrival time calculated for each corresponding clock driven cell;
   (d) it a signal path having a first hold time violation is detected by the timing analysis, then inserting a first butter to delay the clock arrival time at the corresponding clock driven cell by a first selected delay time to correct the first hold time violation; and
   (e) if a second hold time violation is introduced in a second signal path by the insertion of the first buffer, then inserting a second buffer in the second signal path to delay a signal arrival time by a second selected delay time to correct the second hold time violation wherein step (d) comprises inserting the first buffer delay at a clock input of the corresponding clock driven cell in the balanced clock tree.

7. A computer program product comprising:
   a medium for embodying a computer program for input to a computer; and
   a computer program embodied in the medium for causing the computer to perform the following functions:
   (a) constructing an initial balanced clock tree for an integrated circuit design;
   (b) calculating a clock arrival time for each clock driven cell in the initial clock tree;
   (c) performing a timing analysis from the clock arrival time calculated for cacti corresponding clock driven cell;
   (d) if a signal path having a first hold time violation is detected by the timing analysis, then inserting a first buffer to delay the clock arrival time at the corresponding clock driven cell by a first selected delay time to correct the first hold time violation; and
   (e) if a second hold time violation is introduced in a second signal path by the insertion of the first buffer, then inserting a second buffer in the second signal path to delay a signal arrival time by a second selected delay time to correct the second hold time violation wherein the first buffer is selected so as not to create a hold timing violation in another signal path.

8. A computer program product comprising:
   a medium for embodying a computer program for input to a computer; and
   a computer program embodied in the medium for causing the computer to perform the following functions:
   (a) constructing an initial balanced clock tree for an integrated circuit design;
   (b) calculating a clock arrival time for each clock driven cell in the initial clock tree;
   (c) performing a timing analysis from the clock arrival time calculated for each corresponding clock driven cell;
   (d) if a signal path having a first hold time violation is detected by the timing analysis, then inserting a first buffer to delay the clock arrival time at the corresponding clock driven cell by a first selected delay time to correct the first hold time violation; and
   (e) if a second hold time violation is introduced in a second signal path by the insertion of the first buffer, then inserting a second buffer in the second signal path to delay a signal arrival time by a second selected delay time to correct the second hold time violation wherein step (e) comprises inserting the second buffer in a signal path between two clock driven cells.

9. A computer program product comprising:
   a medium for embodying a computer program for input to a computer; and
   a computer program embodied in the medium for causing the computer to perform the following functions:
   (a) constructing an initial balanced clock tree for an integrated circuit design;
   (b) calculating a clock arrival time for each clock driven cell in the initial clock tree;
   (c) performing a timing analysis from the clock arrival time calculated for each corresponding clock driven cell;

(d) if a signal path having a first hold time violation is detected by the timing analysis, then inserting a first buffer to delay the clock arrival time at the corresponding clock driven cell by a first selected delay time to correct the first hold time violation; and
(e) if a second hold time violation is introduced in a second signal path by the insertion of the first buffer, then inserting a second buffer in the second signal path to delay a signal arrival time by a second selected delay time to correct the second hold time violation further comprising updating the balanced clock tree when a buffer is inserted therein for concurrent analysis of timing problems during cell placement.

* * * * *